United States Patent
McNamara et al.

[11] Patent Number: 6,125,465
[45] Date of Patent: Sep. 26, 2000

[54] ISOLATION/REMOVAL OF FAULTS DURING LBIST TESTING

[75] Inventors: Timothy G. McNamara, Fishkill; William V. Huott, Holmes; Timothy J. Koprowski, Newburgh, all of N.Y.

[73] Assignee: International Business Machines Corporation, Armonk, N.Y.

[21] Appl. No.: 09/004,873

[22] Filed: Jan. 9, 1998

[51] Int. Cl.[7] ................................................. G01R 31/28
[52] U.S. Cl. ........................................ 714/733; 714/744
[58] Field of Search ................................... 714/733, 734, 714/724, 731, 744, 742, 30, 6; 365/201; 324/73.1

[56] References Cited

U.S. PATENT DOCUMENTS

| | | | |
|---|---|---|---|
| 4,813,005 | 3/1989 | Redig et al. | 364/580 |
| 5,347,523 | 9/1994 | Khatri et al. | 714/728 |
| 5,422,915 | 6/1995 | Byers et al. | 375/357 |
| 5,481,671 | 1/1996 | Fijisaki | 714/8 |
| 5,553,236 | 9/1996 | Revilla et al. | 714/25 |
| 5,673,273 | 9/1997 | Almy | 714/724 |
| 5,783,960 | 7/1998 | Lackey | 327/295 |

*Primary Examiner*—Hoa T. Nguyen
*Attorney, Agent, or Firm*—Lynn L. Augspurger

[57] ABSTRACT

A method of LBIST testing of an entire chip (i.e. all logic and arrays are getting system clocks) enables finding intermittent fault in an area, such as the L1 cache. Latches such as GPTR latches can be set such that the L1 cache will no longer receive system clocks during LBIST testing. Logic causing an intermittent failure will no longer receive system clocks and hence will no longer cause intermittent LBIST signatures. LBIST testing can proceed on looking for the next failure, if one existed, or proving that the remaining logic contains no faults. Generally, a chip, has a basic clock distribution and control system that the chip is divided into a number (N) of functional units with each unit receiving system clocks from its own clock control macro. Each clock control macro receives an oscillator signal and a bit from the GPTR (General Purpose Test Register). All the functional units contain latches that are connected into one scan chain.

2 Claims, 1 Drawing Sheet

ISOLATION/REMOVAL OF FAULTS DURING LBIST TESTING

FIELD OF THE INVENTION

This invention is related to computer system chips and in particular to an improved isolation/removal of faults during logic built in self test (LBIST) testing via clock system controls.

BACKGROUND OF THE INVENTION

LBIST (Logic Built In Self Test) was (and still is) used extensively within IBM on chips to test for both DC and AC faults in the logic and some portions of the arrays. Published materials about LBIST include IBM's TDB v38 n11 of 11-95, dealing with a method an apparatus for handling multiple clock domains within a single logic built-in self test structure. This is but an example of testing during the debug of IBM's system chips. LBIST testing has been used to diagnose and characterize chip problems and uncovered a number of unique failure mechanisms. Two examples of these failure mechanisms are:

1) Coupled noise causing critical signals to change their delay as well as causing latches to change states when certain test patterns were executed.

2) A wide range in process parameters of the chips that were manufactured (for example very strong P-fets with very weak N-fets) stressed some of the dynamic circuits in the arrays, causing intermittent failures.

If these failure mechanisms result in "hard" repeatable faults, LBIST testing could still be used to test the remaining logic since there are known mathematical formulas for determining a new "valid signature" when a "hard" fault exists.

Unfortunately these failure mechanisms resulted in faults that were intermittent and very sensitive to environmental conditions such as power supply and temperature. Hence, LBIST could not be used to test the remaining logic on the chip because we could not determine what the "valid signature" should be. This one intermittent fault could be masking a number of other faults, that may be real design problems, yet LBIST would not be able to test for these faults. This would be desirable.

SUMMARY OF THE INVENTION

Our invention provides a way of testing a chip in parts by testing areas where control can be maintained for those sections of the chip that receive system clocks. In the case where intermittent faults are found to exist on the chip, the sections of the chip that produce intermittent faults can be isolated and removed from generating intermittent LBIST signatures. In addition, we can minimize the power supply noise to an acceptable level by maintaining control over those sections of the chip that receive system clocks.

The improvements which we have made achieve a way to use LBIST as a standard industry manufacturing test technique for these problem areas and this approach expands the capabilities of LBIST such that it can be used to diagnose and characterize chip problems by the industry.

These and other improvements are set forth in the following detailed description. For a better understanding of the invention with advantages and features, refer to the description with reference to the following drawing.

Figure 1:
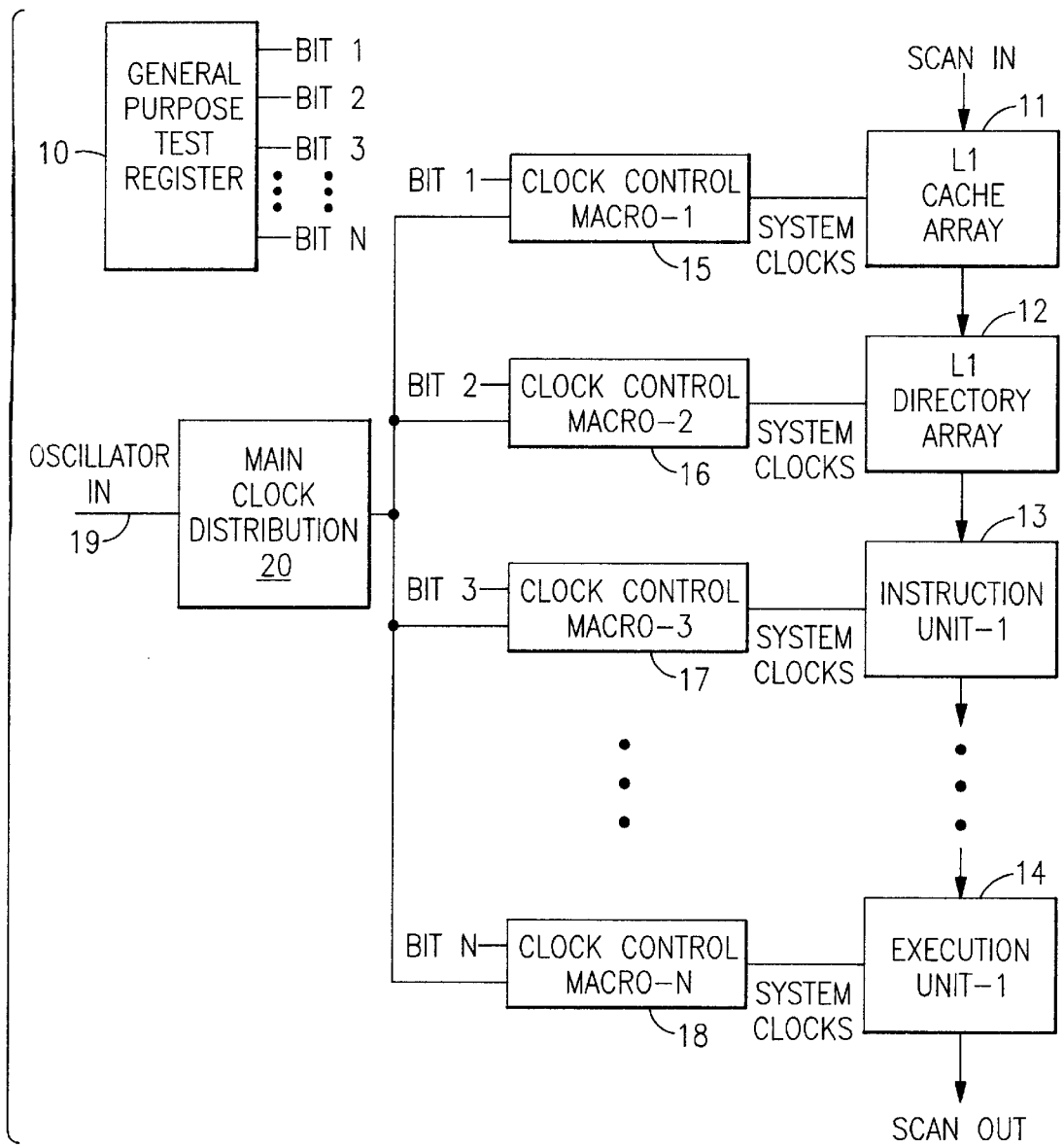
FIG. 1 shows schematically an overview of the preferred embodiment of a chip.

(Note: For convenience of illustration, the FIGURE may be separated in parts and as a convention we place the top of the FIGURE as the first sheet, with subsequent sheets proceeding down and across when viewing the FIGURE, in the event that multiple sheets are used.)

DETAILED DESCRIPTION OF THE INVENTION

Before considering our preferred embodiments in detail, it may be worthwhile to note, by way of example, that in accordance with our invention, if we start LBIST testing the entire chip (i.e. all logic and arrays are getting system clocks) and find an intermittent fault in the L1 cache, we could set the GPTR 10 latches shown in FIG. 1 having bits 1, 2, 3 . . . N such that the L1 cache will no longer receive system clocks during LBIST testing. Hence the logic causing the intermittent failure will no longer receive system clocks and hence will no longer cause intermittent LBIST signatures. LBIST testing can proceed on looking for the next failure, if one existed, or proving that the remaining logic contains no faults.

Turning now to our invention in greater detail, it will be seen from FIG. 1 showing a chip with a basic clock distribution and control system that the chip is divided into a number (N) of functional units with each unit receiving system clocks from its own clock control macro. Each clock control macro receives an oscillator signal and a bit from the GPTR (General Purpose Test Register). All the functional units, the L1 cache array 11, the L1 directory array 12, the Instruction Unit 13, the Execution Unit 14, listed in FIG. 1 and any others on the chip contain latches that are connected into one scan chain (Scan In to Scan Out). FIG. 1 which illustrates our preferred embodiment in which the chip is divided up into a number (N) of functional units (e.g. 11, 12, 13, 14) with each unit's system clock being controlled independently from its own unique clock control macro 15, 16, 17, 18. The clock macro uses the oscillator input 19 to generate system clocks to the functional unit that it is connected to via the main clock distribution unit 20. The GPTR bit is used by the clock control macro to stop or gate-off the system clocks when the GPTR bit is set to a binary '1' value. If and when a functional unit on the chip experiences an intermittent fault, we can simply set the GPTR bit that stops the system clocks to that functional unit. The LBIST test can then be run with the clocks to that functional unit shut off to test the remaining logic on the chip that receives clocks.

As we just described we isolate and remove the logic that was causing an intermittent fail so LBIST could continue to be used to search for the next failure if any existed by using on-chip clock control and distribution logic to individually control the clocks to each unique array and to a number of different logic sections on the chip. A set of scan only GPTR (General Purpose Test Registers) is used to determine what arrays and sections of logic will receive system clocks during LBIST testing.

A sufficient number of GPTR's will be used to divide a chip into many individually controllable sections. Under this design multiple faults can be isolated and removed from the generation of the LBIST signature.

This solution has another advantage that we believe is important for future high performance machines. Since LBIST uses pseudo random patterns to test the chip, the switching activity of the logic under test is on average 50%, which is much higher than the switching activity when the chip is functioning under "normal" operating conditions. As chip speeds and density increase, the amount of instantaneous power supply noise and its influence of the operation of the circuits is becoming a real concern under these very stressful test conditions. By maintaining control of the system clocks to various sections of the chips, one can minimize the power supply noise to an acceptable level.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A method for LBIST testing a chip, said chip comprises a plurality of functional units each functional unit includes at least a logic section, and a control system including a plurality of clock control macros each clock control macro is for each functional unit, the control system is for supplying system clocks and control signals to the logic sections of the functional units, the method comprising the steps of:

independently enabling, by the control system, each of said clock control macros for each of said functional units to be tested so that said each functional unit can be tested independently from remain functional units and for generating system clocks for said each functional unit to be tested;

selectively testing logic sections of functional units that are generated with the system clocks for intermittent faults to characterize any chip problems;

if intermittent faults are found, isolating the tested logic sections of the functional units that generate the found intermittent faults, then, disabling the logic sections that are found with the intermittent faults for preventing from generating any intermittent LBIST signature, said disabling is performed by disabling the generation of system clocks to said functional units that are isolated in the isolating step in order to remove the faulty functional units from further testing during the LBIST testing.

2. A chip having a LBIST test logic for testing and characterizing any chip problems, comprising:

a plurality of functional units for performing respective functions during normal operation and for being tested by said LBIST test logic during manufacture of the chip, each of said functional units includes at least a logic section having at least a latch, wherein the logic sections with latches of the functional units form a single scan chain for testing;

a clock distribution and GPTR (General Purpose Test Registers) control system having a plurality of clock control macros, each clock control macro is for each of said functional units, said control system enabling each of said clock control macros independently for each of said functional units to be tested so that said each functional unit can be tested independently from the remain functional units and for generating system clocks and control signals to said functional units.

* * * * *